US010043960B2

(12) United States Patent
Andrews et al.

(10) Patent No.: US 10,043,960 B2
(45) Date of Patent: Aug. 7, 2018

(54) LIGHT EMITTING DIODE (LED) PACKAGES AND RELATED METHODS

(75) Inventors: Peter Scott Andrews, Durham, NC (US); Jeffrey Carl Britt, Cary, NC (US)

(73) Assignee: Cree, Inc., Durham, NC (US)

(*) Notice: Subject to any disclaimer, the term of this patent is extended or adjusted under 35 U.S.C. 154(b) by 582 days.

(21) Appl. No.: 13/296,812

(22) Filed: Nov. 15, 2011

(65) Prior Publication Data
US 2013/0119417 A1    May 16, 2013

(51) Int. Cl.
| | | |
|---|---|---|
| *H01L 33/08* | (2010.01) | |
| *H01L 33/38* | (2010.01) | |
| *H01L 33/62* | (2010.01) | |
| *H01L 33/60* | (2010.01) | |
| H01L 33/20 | (2010.01) | |
| H01L 25/075 | (2006.01) | |
| H01L 33/64 | (2010.01) | |

(Continued)

(52) U.S. Cl.
CPC .............. *H01L 33/62* (2013.01); *H01L 33/60* (2013.01); *H01L 23/3735* (2013.01); *H01L 25/0753* (2013.01); *H01L 33/641* (2013.01); *H01L 2224/48091* (2013.01); *H01L 2224/48227* (2013.01); *H01L 2924/12032* (2013.01); *H05K 1/0269* (2013.01); *H05K 1/0306* (2013.01); *H05K 3/06* (2013.01); *H05K 3/16* (2013.01); *H05K 2201/0338* (2013.01); *H05K 2201/09036* (2013.01); *H05K 2201/09227* (2013.01); *H05K 2201/10106* (2013.01); *H05K 2201/2054* (2013.01)

(58) Field of Classification Search
CPC ..... H01L 27/153; H01L 27/156; H01L 25/18; H01L 25/0753; H01L 33/58–33/60; H01L 2924/12041; H01L 33/62; H01L 2224/48227; H01L 2224/48091
USPC ........ 257/13, 79, 88, 98, 703, 724, E33.056, 257/E23.009; 438/26–28
See application file for complete search history.

(56) References Cited

U.S. PATENT DOCUMENTS

| | | |
|---|---|---|
| 4,939,426 A | 7/1990 | Menard |
| 4,946,547 A | 8/1990 | Palmour et al. |

(Continued)

FOREIGN PATENT DOCUMENTS

| | | |
|---|---|---|
| CN | 1992365 A | 7/2007 |
| CN | 101876406 A | 11/2010 |

(Continued)

OTHER PUBLICATIONS

Restriction Requirement for U.S. Appl. No. 13/152,772 dated Sep. 26, 2013.

(Continued)

*Primary Examiner* — Maliheh Malek
(74) *Attorney, Agent, or Firm* — Jenkins, Wilson, Taylor & Hunt, P.A.

(57) ABSTRACT

Light emitting diode (LED) packages and methods are disclosed herein. In one aspect, a light emitting package is disclosed. The light emitting package includes one or more areas of conductive material having a thickness of less than approximately 50 microns (μm). The package can further include at least one light emitting diode (LED) electrically connected to the conductive material and at least one thin gap disposed between areas of conductive material.

33 Claims, 8 Drawing Sheets

(51) Int. Cl.
*H01L 23/373* (2006.01)
*H05K 1/03* (2006.01)
*H05K 1/02* (2006.01)
*H05K 3/06* (2006.01)
*H05K 3/16* (2006.01)

(56) References Cited

U.S. PATENT DOCUMENTS

| | | | |
|---|---|---|---|
| 5,200,022 A | 4/1993 | Kong et al. | |
| 5,210,051 A | 5/1993 | Carter | |
| 5,334,916 A | 8/1994 | Noguchi | |
| RE34,861 E | 2/1995 | Robert et al. | |
| 5,393,993 A | 2/1995 | Edmond et al. | |
| 5,523,589 A | 6/1996 | Edmond et al. | |
| 5,847,340 A | 12/1998 | Godesa | |
| 5,929,568 A | 7/1999 | Eggers | |
| 6,362,525 B1 * | 3/2002 | Rahim | H01L 23/49838 257/528 |
| 6,385,226 B2 | 5/2002 | McMinn et al. | |
| 6,441,558 B1 | 8/2002 | Muthu et al. | |
| 6,498,440 B2 | 12/2002 | Stam et al. | |
| 6,531,328 B1 * | 3/2003 | Chen | 438/26 |
| 6,611,001 B2 * | 8/2003 | Cappuzzo et al. | 257/81 |
| 6,617,795 B2 | 9/2003 | Bruning | |
| 6,636,003 B2 | 10/2003 | Rahm et al. | |
| 6,697,130 B2 | 2/2004 | Weindorf et al. | |
| 6,753,661 B2 | 6/2004 | Muthu et al. | |
| 6,788,011 B2 | 9/2004 | Mueller et al. | |
| 6,864,641 B2 | 3/2005 | Dygert | |
| 6,885,035 B2 | 4/2005 | Bhat et al. | |
| 6,998,594 B2 | 2/2006 | Gaines et al. | |
| 7,038,399 B2 | 5/2006 | Lys et al. | |
| 7,067,995 B2 | 6/2006 | Gunter et al. | |
| 7,084,935 B2 * | 8/2006 | Mandler et al. | 349/58 |
| 7,091,874 B2 | 8/2006 | Smithson | |
| 7,213,940 B1 | 5/2007 | Van et al. | |
| 7,233,831 B2 | 6/2007 | Blackwell | |
| 7,238,898 B1 | 7/2007 | Czarnecki | |
| 7,245,089 B2 | 7/2007 | Yang | |
| 7,291,866 B2 | 11/2007 | Oshio et al. | |
| 7,352,138 B2 | 4/2008 | Lys et al. | |
| 7,358,679 B2 | 4/2008 | Lys et al. | |
| 7,365,371 B2 * | 4/2008 | Andrews | H01L 33/52 257/100 |
| 7,432,668 B2 | 10/2008 | Zwanenburg et al. | |
| 7,515,128 B2 | 4/2009 | Dowling | |
| 7,569,987 B2 | 8/2009 | Naitou | |
| 7,655,957 B2 * | 2/2010 | Loh et al. | 257/99 |
| 7,772,757 B2 | 8/2010 | Kane et al. | |
| 7,808,013 B2 * | 10/2010 | Mendendorp, Jr. | H01L 33/64 257/675 |
| 7,808,189 B2 | 10/2010 | Hollnberger | |
| 7,812,553 B2 | 10/2010 | Kang et al. | |
| 7,821,194 B2 | 10/2010 | Negley et al. | |
| 7,897,980 B2 * | 3/2011 | Yuan | F21K 9/00 257/79 |
| 8,044,612 B2 | 10/2011 | Prendergast | |
| 8,058,088 B2 | 11/2011 | Cannon | |
| D650,343 S * | 12/2011 | Andrews | D13/180 |
| 8,174,212 B2 | 5/2012 | Tziony | |
| 8,212,275 B2 | 7/2012 | Yamada | |
| 8,278,846 B2 | 10/2012 | Roberts | |
| 8,299,715 B2 | 10/2012 | Philippbar | |
| 8,333,631 B2 | 12/2012 | Emerson | |
| 8,354,684 B2 * | 1/2013 | West | 257/98 |
| 8,405,318 B2 | 3/2013 | Hatakenaka | |
| 8,410,371 B2 * | 4/2013 | Andrews | H01L 23/3677 174/252 |
| 8,461,613 B2 | 6/2013 | Chou et al. | |
| 8,471,495 B2 | 6/2013 | Muguruma | |
| 8,507,786 B1 * | 8/2013 | Wieting | H01L 31/0463 136/244 |
| 8,556,438 B2 | 10/2013 | McKenzie | |
| 8,587,205 B2 | 11/2013 | Ter Weeme et al. | |
| 8,593,481 B2 | 11/2013 | Morgenbrod | |
| 8,610,134 B2 * | 12/2013 | Andrews | H01L 33/62 257/80 |
| 8,664,892 B2 | 3/2014 | Radermacher | |
| 8,692,799 B1 * | 4/2014 | Landry | G06F 3/0416 345/173 |
| 8,729,589 B2 | 5/2014 | Hussell et al. | |
| 8,803,201 B2 * | 8/2014 | Andrews | H01L 33/60 257/198 |
| 8,835,952 B2 * | 9/2014 | Andrews | H01L 33/54 257/98 |
| 8,937,557 B2 | 1/2015 | Loveland | |
| 9,155,172 B2 * | 10/2015 | Baragona | H05B 37/0272 |
| 9,192,013 B1 | 11/2015 | van de Ven | |
| 9,194,567 B2 | 11/2015 | Hussell et al. | |
| D753,612 S * | 4/2016 | Hussell | D13/180 |
| 9,538,590 B2 * | 1/2017 | Hussell | H05B 33/0806 |
| 2001/0032985 A1 | 10/2001 | Bhat et al. | |
| 2002/0047624 A1 | 4/2002 | Stam et al. | |
| 2003/0038295 A1 | 2/2003 | Koda | |
| 2004/0065894 A1 * | 4/2004 | Hashimoto | H01L 33/642 257/100 |
| 2004/0079957 A1 * | 4/2004 | Andrews et al. | 257/100 |
| 2004/0135156 A1 * | 7/2004 | Takenaka | H01L 33/642 257/79 |
| 2004/0169466 A1 | 9/2004 | Suehiro et al. | |
| 2004/0245946 A1 | 12/2004 | Halter | |
| 2005/0051789 A1 * | 3/2005 | Negley et al. | 257/99 |
| 2005/0127381 A1 | 6/2005 | Vitta et al. | |
| 2005/0199884 A1 * | 9/2005 | Lee | H01L 33/54 257/79 |
| 2005/0199899 A1 | 9/2005 | Lin et al. | |
| 2005/0280376 A1 | 12/2005 | Hamidian et al. | |
| 2006/0016960 A1 | 1/2006 | Morgan et al. | |
| 2006/0157828 A1 * | 7/2006 | Sorg | H01L 31/0203 257/666 |
| 2006/0180818 A1 | 8/2006 | Nagai et al. | |
| 2006/0186418 A1 | 8/2006 | Edmond et al. | |
| 2006/0186535 A1 * | 8/2006 | Baker | H01L 23/3677 257/720 |
| 2006/0226956 A1 | 10/2006 | Young et al. | |
| 2006/0273331 A1 | 12/2006 | Lim et al. | |
| 2006/0278882 A1 * | 12/2006 | Leung et al. | 257/98 |
| 2007/0040512 A1 | 2/2007 | Jungwirth et al. | |
| 2007/0057364 A1 * | 3/2007 | Wang et al. | 257/701 |
| 2007/0080360 A1 * | 4/2007 | Mirsky | H01L 23/3677 257/99 |
| 2007/0085194 A1 * | 4/2007 | Mao et al. | 257/700 |
| 2007/0115228 A1 | 5/2007 | Roberts | |
| 2007/0115248 A1 | 5/2007 | Roberts et al. | |
| 2007/0115662 A1 | 5/2007 | Roberts | |
| 2007/0139920 A1 | 6/2007 | Van de Ven et al. | |
| 2007/0158668 A1 | 7/2007 | Tarsa | |
| 2007/0170447 A1 | 7/2007 | Negley et al. | |
| 2007/0170454 A1 * | 7/2007 | Andrews | 257/100 |
| 2007/0235751 A1 | 10/2007 | Radkov | |
| 2007/0247089 A1 | 10/2007 | Summerland | |
| 2007/0247855 A1 | 10/2007 | Yano | |
| 2007/0252523 A1 | 11/2007 | Maeda et al. | |
| 2007/0253209 A1 | 11/2007 | Loh et al. | |
| 2007/0263393 A1 | 11/2007 | Van de Ven et al. | |
| 2007/0267983 A1 | 11/2007 | Van de Ven et al. | |
| 2008/0037257 A1 | 2/2008 | Bolta | |
| 2008/0054286 A1 * | 3/2008 | Loh et al. | 257/98 |
| 2008/0062070 A1 | 3/2008 | De Oto et al. | |
| 2008/0136331 A1 | 6/2008 | Schmeikal | |
| 2008/0164484 A1 | 7/2008 | Lee | |
| 2008/0170396 A1 * | 7/2008 | Yuan et al. | 362/244 |
| 2008/0173884 A1 | 7/2008 | Chitnis | |
| 2008/0179602 A1 | 7/2008 | Negley et al. | |
| 2008/0179611 A1 | 7/2008 | Chitnis | |
| 2008/0215279 A1 | 9/2008 | Salsbury et al. | |
| 2008/0258130 A1 | 10/2008 | Bergmann et al. | |
| 2008/0304260 A1 | 12/2008 | Van et al. | |
| 2008/0315214 A1 | 12/2008 | Wall, Jr. et al. | |
| 2009/0079362 A1 | 3/2009 | Shteynberg et al. | |
| 2009/0108281 A1 * | 4/2009 | Keller | H01L 33/62 257/98 |

(56) References Cited

U.S. PATENT DOCUMENTS

| | | | |
|---|---|---|---|
| 2009/0121253 A1* | 5/2009 | Abe | H01L 33/54 257/99 |
| 2009/0160363 A1 | 6/2009 | Negley | |
| 2009/0184616 A1 | 7/2009 | Van de Ven et al. | |
| 2009/0189529 A1 | 7/2009 | Negley et al. | |
| 2009/0206758 A1 | 8/2009 | Kobilke | |
| 2009/0207111 A1 | 8/2009 | Wang et al. | |
| 2009/0212317 A1* | 8/2009 | Kolodin et al. | 257/99 |
| 2009/0230409 A1* | 9/2009 | Basin | H01L 33/54 257/88 |
| 2009/0243509 A1 | 10/2009 | Barnett et al. | |
| 2009/0262527 A1 | 10/2009 | Chou | |
| 2009/0273001 A1* | 11/2009 | Shum | H01L 24/06 257/99 |
| 2009/0289169 A1 | 11/2009 | Yang et al. | |
| 2010/0001648 A1 | 1/2010 | De Clercq et al. | |
| 2010/0002440 A1 | 1/2010 | Negley et al. | |
| 2010/0014030 A1* | 1/2010 | Lin | G02F 1/1345 349/84 |
| 2010/0102199 A1 | 4/2010 | Negley et al. | |
| 2010/0103660 A1 | 4/2010 | Van de Ven et al. | |
| 2010/0127282 A1 | 5/2010 | Harbers et al. | |
| 2010/0127283 A1 | 5/2010 | Van de Ven et al. | |
| 2010/0140751 A1* | 6/2010 | Tay | H01L 21/76898 257/621 |
| 2010/0141159 A1 | 6/2010 | Shiu et al. | |
| 2010/0155763 A1 | 6/2010 | Donofrio | |
| 2010/0252851 A1* | 10/2010 | Emerson et al. | 257/98 |
| 2010/0258819 A1* | 10/2010 | Marfeld | H01L 25/0753 257/80 |
| 2010/0259930 A1* | 10/2010 | Yan | F21K 9/00 362/235 |
| 2010/0270567 A1 | 10/2010 | Emerson et al. | |
| 2010/0288536 A1* | 11/2010 | Chiang | H01L 23/3677 174/252 |
| 2010/0308738 A1 | 12/2010 | Shteynberg et al. | |
| 2011/0012143 A1* | 1/2011 | Yuan et al. | 257/91 |
| 2011/0031516 A1* | 2/2011 | Basin | H01L 33/507 257/98 |
| 2011/0037413 A1 | 2/2011 | Negley et al. | |
| 2011/0049558 A1* | 3/2011 | Lin | H01L 24/18 257/99 |
| 2011/0062872 A1 | 3/2011 | Jin et al. | |
| 2011/0068696 A1 | 3/2011 | Van et al. | |
| 2011/0068701 A1 | 3/2011 | Van et al. | |
| 2011/0068702 A1 | 3/2011 | Van et al. | |
| 2011/0084614 A1 | 4/2011 | Eisele et al. | |
| 2011/0090691 A1* | 4/2011 | Markle | F21K 9/00 362/249.02 |
| 2011/0140150 A1 | 6/2011 | Shum | |
| 2011/0175136 A1* | 7/2011 | Lin et al. | 257/99 |
| 2011/0186340 A1* | 8/2011 | Kuramoto | H01B 1/22 174/260 |
| 2011/0186874 A1* | 8/2011 | Shum | H01L 25/0753 257/88 |
| 2011/0193112 A1* | 8/2011 | Inoue | F21K 9/00 257/91 |
| 2011/0216797 A1* | 9/2011 | Watanabe | H01S 5/0601 372/45.012 |
| 2011/0221330 A1* | 9/2011 | Negley et al. | 313/501 |
| 2011/0254022 A1* | 10/2011 | Sasano | H01L 25/0753 257/88 |
| 2011/0260199 A1* | 10/2011 | Andrews | H01L 33/486 257/99 |
| 2011/0278638 A1* | 11/2011 | Lin | H01L 21/486 257/99 |
| 2011/0287563 A1* | 11/2011 | Lin et al. | 438/26 |
| 2011/0291114 A1 | 12/2011 | Cheng | |
| 2011/0310033 A1* | 12/2011 | Liu | G06F 3/044 345/173 |
| 2012/0049213 A1* | 3/2012 | Chen | H01L 25/0753 257/89 |
| 2012/0049224 A1* | 3/2012 | Mizutani | H01L 27/153 257/98 |
| 2012/0068198 A1* | 3/2012 | Andrews | H01L 25/0753 257/88 |
| 2012/0080713 A1* | 4/2012 | Agatani | H01L 25/0753 257/99 |
| 2012/0086024 A1* | 4/2012 | Andrews | H01L 25/0753 257/88 |
| 2012/0105228 A1 | 5/2012 | Loveland et al. | |
| 2012/0126257 A1* | 5/2012 | Reiherzer | H01L 25/0753 257/88 |
| 2012/0175643 A1* | 7/2012 | West | 257/88 |
| 2012/0187430 A1* | 7/2012 | West et al. | 257/88 |
| 2012/0193649 A1* | 8/2012 | Donofrio | H01L 25/0753 257/88 |
| 2012/0193651 A1* | 8/2012 | Edmond | H01L 25/0753 257/88 |
| 2012/0193662 A1* | 8/2012 | Donofrio et al. | 257/98 |
| 2012/0205689 A1* | 8/2012 | Welch | H01L 25/0753 257/91 |
| 2012/0205790 A1* | 8/2012 | Haga | H01L 21/4842 257/676 |
| 2012/0305949 A1* | 12/2012 | Donofrio | H01L 25/0753 257/88 |
| 2012/0306370 A1 | 12/2012 | Van et al. | |
| 2012/0306375 A1 | 12/2012 | Van et al. | |
| 2013/0001618 A1* | 1/2013 | Imai | H01L 33/486 257/98 |
| 2013/0001632 A1* | 1/2013 | Imai | H01L 33/62 257/99 |
| 2013/0001633 A1* | 1/2013 | Imai | H01L 33/60 257/99 |
| 2013/0009183 A1* | 1/2013 | Han | 257/98 |
| 2013/0020929 A1* | 1/2013 | van de Ven | H01L 25/0753 313/498 |
| 2013/0049045 A1* | 2/2013 | Lee | H01L 33/486 257/98 |
| 2013/0052764 A1* | 2/2013 | Chen | H05K 1/189 438/26 |
| 2013/0062640 A1* | 3/2013 | Yen et al. | 257/77 |
| 2013/0070480 A1* | 3/2013 | Griffin | G02B 6/0028 362/612 |
| 2013/0077299 A1* | 3/2013 | Hussell | F21K 9/50 362/231 |
| 2013/0087367 A1* | 4/2013 | Imai | H01L 33/647 174/252 |
| 2013/0088867 A1* | 4/2013 | Chung | F21V 19/003 362/238 |
| 2013/0092960 A1* | 4/2013 | Wilcox et al. | 257/88 |
| 2013/0134467 A1* | 5/2013 | Ooyabu | F21V 21/00 257/99 |
| 2013/0141905 A1* | 6/2013 | Hussell | H01L 33/54 362/235 |
| 2013/0161658 A1* | 6/2013 | Lin et al. | 257/88 |
| 2013/0170208 A1* | 7/2013 | Kuwaharada | H01L 33/54 362/243 |
| 2013/0193453 A1* | 8/2013 | Donofrio | H01L 25/0753 257/88 |
| 2013/0221386 A1* | 8/2013 | Mo et al. | 257/93 |
| 2013/0256710 A1* | 10/2013 | Andrews et al. | 257/88 |
| 2013/0258658 A1* | 10/2013 | Hussell et al. | 362/235 |
| 2013/0270581 A1* | 10/2013 | Lowes et al. | 257/77 |
| 2013/0301257 A1* | 11/2013 | Britt et al. | 362/231 |
| 2013/0322068 A1* | 12/2013 | Clark et al. | 362/235 |
| 2014/0017828 A1* | 1/2014 | Wu et al. | 438/27 |
| 2014/0021493 A1* | 1/2014 | Andrews et al. | 257/88 |
| 2014/0175466 A1* | 6/2014 | de Samber | H01L 25/0753 257/88 |
| 2014/0183568 A1* | 7/2014 | Andrews | H01L 33/62 257/88 |
| 2014/0191655 A1* | 7/2014 | Kasakura | H01L 25/0753 315/32 |
| 2014/0209887 A1* | 7/2014 | Chang | H01L 51/5209 257/40 |
| 2014/0225152 A1* | 8/2014 | Asahi | H01L 33/62 257/99 |

(56) References Cited

U.S. PATENT DOCUMENTS

| | | | |
|---|---|---|---|
| 2014/0239316 A1* | 8/2014 | Andrews | F21K 9/137 257/88 |
| 2014/0240974 A1 | 8/2014 | Hussell et al. | |
| 2014/0268780 A1* | 9/2014 | Wang | F21V 19/003 362/249.06 |
| 2014/0367713 A1* | 12/2014 | Zhang | H01L 33/60 257/89 |
| 2015/0048390 A1* | 2/2015 | Imazu | H01L 25/0756 257/88 |
| 2016/0076750 A1* | 3/2016 | Lowenthal | H01L 25/048 362/293 |

FOREIGN PATENT DOCUMENTS

| | | |
|---|---|---|
| CN | 102044602 A | 5/2011 |
| CN | 102148316 A | 8/2011 |
| CN | 104040741 A | 9/2014 |
| CN | 104081112 B | 3/2016 |
| EP | 1670073 A1 | 6/2006 |
| EP | 2780955 | 9/2014 |
| JP | 2003-192442 A | 7/2003 |
| JP | 2003/273404 | 9/2003 |
| JP | 2004-228413 A | 8/2004 |
| JP | 2005-266117 A | 9/2005 |
| JP | 2007-227680 A | 9/2007 |
| JP | 2007-323857 A | 12/2007 |
| JP | 2009/049010 | 3/2009 |
| JP | 2009-283829 | 12/2009 |
| KR | 10-0699161 | 3/2007 |
| KR | 10-2011-0028204 | 3/2011 |
| WO | WO 03/096761 | 11/2003 |
| WO | WO 2010/012999 | 2/2010 |
| WO | WO 2013/074630 | 5/2013 |

OTHER PUBLICATIONS

Non-Final Office Action for U.S. Appl. No. 13/152,640 dated Jul. 5, 2013.
Rensselaer Polytechnic Institute, "What is color consistency?", NLPIP, Lighting Research Center, vol. 8, Issue 1, Oct. 2004, Retrieved from http://www.lrc.rpi.edu/programs/nlpip/lightinganswers/lightsources/whatisColorConsistency.asp.
International Search Report for Application No. PCT/US2012/040189 dated Aug. 20, 2012.
International Search Report and Written Opinion for Application No. PCT/US2012/039984 dated Nov. 30, 2012
International Search Report and Written Opinion for Application No. PCT/US2012/064434 dated Jan. 25, 2013.
International Search Report and Written Opinion for Application No. PCT/US2012/065016 dated Mar. 29, 2013.
Non-Final Office Action for U.S. Appl. No. 13/671,089 dated Mar. 29, 2013.
Cree, Inc., "Cree XLamp MC-E LED," Product Family Data Sheet, pp. 1-13 (2008).
Co-pending U.S. Appl. No. 13/152,640, filed Jun. 3, 2011.
Sutardja, P., "Design for High Quality and Low Cost SSL with Power Factor Correction", "Marvell Semiconductor Inc.", 2011.
Non-Final Office Action for U.S. Appl. No. 13/152,772 dated Mar. 11, 2014.
Supplemental European Search Report for Application No. 12849022 dated Jun. 9, 2015, This document has not been found in the record.
Restriction Requirement for U.S. Appl. No. 13/671,089 dated Feb. 7, 2013.
Ex Parte Quayle Office Action for U.S. Appl. No. 13/671,089 dated Aug. 13, 2013.
Notice of Allowance for U.S. Appl. No. 13/671,089 dated Oct. 22, 2013.
Non-Final Office Action for U.S. Appl. No. 14/189,500 dated Jul. 15, 2014.
Notice of Allowance for U.S. Appl. No. 14/189,500 dated Jan. 23, 2015.
Notice of Allowance for U.S. Appl. No. 14/189,500 dated May 14, 2015.
Notice of Allowance for U.S. Appl. No. 14/189,500 dated Jul. 17, 2015.
Chinese Office Action for Application No. 201280067045 dated Mar. 7, 2016.
International Search Report and Written Opinion for Application No. PCT/US2012/063861 dated Mar. 18, 2013.
Final Office Action for U.S. Appl. No. 13/152,772 dated Oct. 23, 2014.
Advisory Action for U.S. Appl. No. 13/152,772 dated Apr. 23, 2015.
Chinese Office Action and Search Report for Application No. 2012800661747 dated Jun. 3, 2015.
Non-Final Office Action for U.S. Appl. No. 13/152,772 dated May 11, 2016.
Chinese Notice of Grant for Application No. ZL 2012800661747 dated May 26, 2016.
Final Rejection for U.S. Appl. No. 13/152,772 dated Nov. 29, 2016.
Advisory Action with Interview Summary for U.S. Appl. No. 13/152,772 dtaed Apr. 6, 2017.

* cited by examiner

LIGHT EMITTING DIODE (LED) PACKAGES AND RELATED METHODS

TECHNICAL FIELD

The subject matter disclosed herein relates generally to light emitting diode (LED) packages and related methods. More particularly, the subject matter disclosed herein relates to LED packages having thin metal components, low thermal resistance, and improved brightness and manufacturing characteristics.

BACKGROUND

Light emitting devices, such as light emitting diodes (LEDs), may be used in packages or devices for providing white light (e.g., perceived as being white or near-white), and are developing as replacements for incandescent, fluorescent, and metal halide light products. In general, LED packages are either ceramic based with copper (Cu) traces or polymer-based with a Cu leadframe, where one or more LEDs electrically communicate with the Cu. For packages using a Cu leadframe, the leadframe needs to have a certain thickness for stability during processing and structural integrity to withstand injection molding forces. In conventional ceramic based packages, the Cu traces used are approximately 50 microns (μm) or greater in thickness. According to conventional wisdom, thick Cu traces are necessary to spread heat and assist with heat flow through the ceramic and away from the LED.

A prior art LED package, generally designated 10 is illustrated in FIG. 1. LED package 10 comprises a ceramic-based submount 12 over which one or more layers of electrically conductive material generally designated 14 can be deposited or otherwise attached. Conventional ceramic-based submounts 12 include, for example, aluminum oxide ($Al_2O_3$). Conductive material 14 can comprise conventional Cu traces which have been electro-plated or otherwise deposited, over submount 12 and electrically isolated. In one aspect, a single layer of Cu can be deposited over submount 12 and then subsequently etched, thereby forming one or more electrically isolated traces 18 and 20. Conductive material 14 can comprise a Cu layer having a thickness of approximately 50 μm or greater. At least one LED 16 can mount to a first trace 18 and electrically connect to a second trace 20 via wirebonding using an electrically conductive wire 22. First and second traces 18 and 20, respectively, can receive electrical signal or current from one or more electrical contacts 24 and 26, respectively. Electrical contacts 24 and 26 can receive an electrical signal from an external source, for example, an electrical circuit. The electrical current can then be passed from first and second traces 18 and 20 into LED 16, thereby illuminating the LED when the electrical energy is converted into light. LED package 10 can further comprise a lens 28.

As known in the art, a gap 30 can be etched or otherwise formed between first and second traces 18 and 20, respectively, and typically results in a gap 30 having approximately a 1:1 aspect ratio between trace thickness and gap width. That is, Cu that is approximately 50 μm in thickness will result in a gap 30 having a depth D of approximately 50 μm and a width W of approximately 50 μm. Thicker gaps 30 can require a larger submount surface area, which is generally undesirable. The size of such a gap can also be disadvantageous as it provides an undesirable larger space for light from the LED to pass into the gap thereby reducing or limiting light output. The relatively high cost and processing time associated with manufacturing devices and packages using Cu traces that are approximately 50 μm or greater in thickness is also undesirable. However, as noted above and according to conventional wisdom, thick Cu traces are necessary to spread heat and assist with heat flow through the ceramic substrate and away from the LED. Despite conventional wisdom and manufacturing difficulties, the subject matter herein advantageously incorporated thinner Cu traces which led to unexpected results of no reduction in LED, device, and/or package performance over time when Cu trace thickness is minimized.

Despite availability of various LED devices and packages in the marketplace, a need remains for improved packages that can be manufactured at a lower cost in less amount of time without compromising LED performance. LED packages and methods disclosed herein advantageously use thin metal components, have low thermal resistance, and have improved light output performance which thereby improves device reliability. Advantages of using thin metal components can include, for example, more efficient LED designs, routing of electrical signal under parts (as opposed to around parts), a reduction in encapsulant, and a simplified, less-expensive manufacturing process (i.e., by eliminating Cu and electroplating processes).

SUMMARY

In accordance with this disclosure, novel LED packages and related methods are provided. In particular, LED packages and related methods are provided with an area of conductive material comprising a thickness less than or equal to approximately 10 microns (μm). One or more thin gaps can be disposed between first and second areas of conductive material.

It is, therefore, an object of the disclosure herein to provide novel LED packages and methods as described for example in further detail herein. Such novel LED packages and methods can comprise low thermal resistance and increased optical performance. These and other objects as can become apparent from the disclosure herein are achieved, at least in whole or in part, by the subject matter described herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
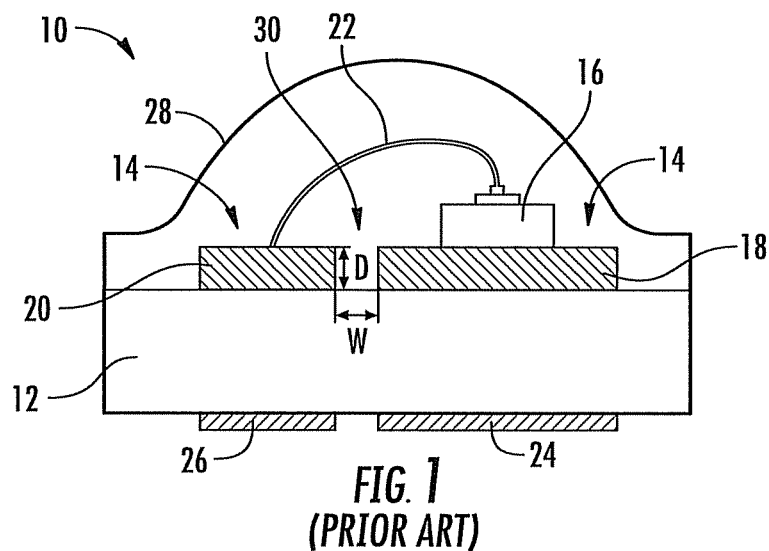
FIG. 1 is a side view of a prior art light emitting diode (LED) package.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the subject matter disclosed herein are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion may be described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. It is understood that these terms are intended to encompass different orientations of the device in addition to the orientation depicted in the figures. Like numbers refer to like elements throughout.

Terms such as first, second, etc. may be used herein to describe various elements, members, components, regions, layers and/or sections, these elements, members, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure herein.

Light emitting devices according to embodiments described herein may comprise group III-V nitride (e.g., gallium nitride) based light emitting diodes (LEDs) or lasers fabricated on a silicon carbide substrate, such as those devices manufactured and sold by Cree, Inc. of Durham, N.C. For example, Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein. For example, sapphire and gallium arsenide can be utilized as growth substrates for fabricating LEDs or lasers as described herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature, and in commonly assigned U.S. Pat. No. 5,210,051, U.S. Pat. No. 5,393,993, and U.S. Pat. No. 5,523,589, the disclosures of which are hereby incorporated by reference herein in their entireties.

Although various embodiments of LEDs disclosed herein comprise a growth substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have different thermal, electrical, structural and/or optical characteristics than the original substrate. The subject matter described herein is not limited to structures having crystalline epitaxial growth substrates and may be used in connection with structures in which the epitaxial layers have been removed from their original growth substrates and bonded to substitute carrier substrates.

Group III nitride based LEDs according to some embodiments of the present subject matter, for example, may be fabricated on growth substrates (such as a silicon carbide substrates) to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board (PCB), or wire bonded. A vertical device (with or without the growth substrate) may have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

Solid state light LEDs may be used individually or in combinations, optionally together with one or more luminescent materials (e.g., phosphors, scintillators, lumiphoric inks) and/or filters, to generate light of desired perceived colors (including combinations of colors that may be perceived as white). Inclusion of luminescent (also called 'lumiphoric') materials in LED packages may be accomplished by adding such materials to encapsulants, adding such materials to lenses, or by direct coating onto LEDs. Other materials, such as dispersers and/or index matching materials may be disposed in such encapsulants.

One or more of the LEDs can be coated, at least partially, with one or more phosphors with the phosphors absorbing at least a portion of the LED light and emitting a different wavelength of light such that the LED emits a combination of light from the LED and the phosphor. In one embodiment, such an LED emits a white light combination of LED and phosphor light. The LED can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Other suitable methods for coating one or more LEDs are described in U.S. patent application Ser. No. 12/014,404, entitled "Phosphor Coating Systems and Methods for Light Emitting Structures and Packaged Light Emitting Diodes Including Phosphor Coating" and the continuation-in-part application U.S. patent application Ser. No. 12/717,048, entitled "Systems and Methods for Application of Optical Materials to Optical Elements", the disclosures of which are hereby incorporated by reference herein in their entireties. LEDs can also be coated using other methods such electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages and methods according to the present subject matter can also have multiple LEDs of different colors, one or more of which may be white emitting.

FIGS. 2 to 9 illustrate embodiments and/or characteristics of packages containing one or more LEDs. In general, LED packages disclosed in FIGS. 2 to 9 can comprise a relatively low thermal resistance while maintaining high brightness performance. For example, ninety-five percent of packages tested for example and disclosed in FIG. 9 herein exhibited a luminous flux output of at least approximately 1,244 lumens or greater at 250 mA. As discussed further below, the low thermal resistance of packages disclosed herein can at least partially be attributed to the submount material chosen for use in the packages. That is, a submount material with a lower thermal resistance, or high heat conductivity, can dissipate heat away from one or more LEDs more efficiently and allow the package to run cooler at steady state thereby increasing the lumen output. Packages disclosed herein can also utilize thin metal components which in turn have smaller gaps disposed therebetween. Smaller gaps can decrease the amount of light that may become trapped and/or blocked by the gaps and therefore can result in brighter packages having an increased lumen output. As discussed further below, thin metal components can also increase the coverage area of a reflective material which can further contribute to increased lumen output of LED packages. In general, packages disclosed herein can be simpler and less expensive to manufacture, at least partly because of a reduced amount of copper (Cu) and/or other material used to establish thin metal components such as conductive traces.

Figure 2:
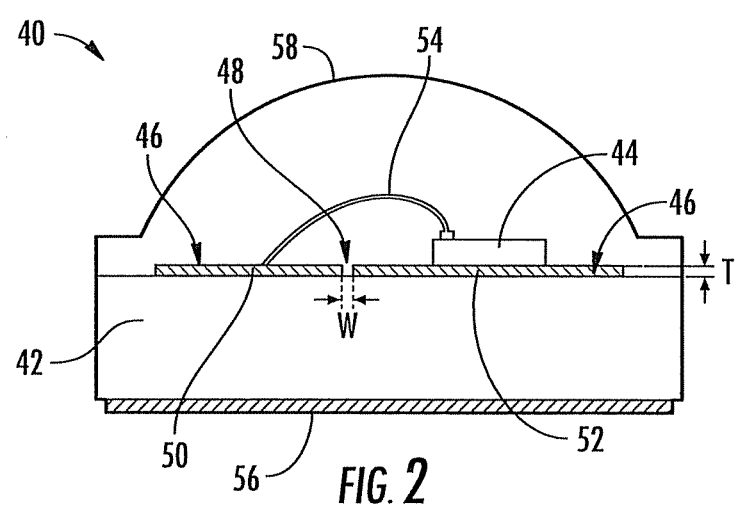
FIG. 2 is a side view illustrating an embodiment of an LED package according to the subject matter disclosed herein.

FIG. 2 illustrates an LED package generally designated 40. LED package 40 can comprise a substrate or submount 42 with at least one LED 44 disposed over submount 42. In one aspect, LED package 40 can comprise more than one LED 44 optionally arranged in an array. The LEDs such as LED 44 can emit light that can be approximately the same and/or different in wavelength. Where multiple LEDs 44 are used, the LEDs 44 can comprise similar and/or different targeted wavelength bins including red, blue, green, amber, red-orange and/or a combination thereof. LED package 40 can comprise a plurality of LEDs 44 comprising a plurality of colors, for example, each LED 44 in a given arrangement can be selected from a different targeted wavelength bin. For example, at least one LED 44 forming the plurality can comprise LEDs targeting each of red, green, blue, and/or white bins (RGBW) or red, green, blue, and/or amber bins (RGBA).

As noted above, one or more LEDs 44 in package 40 can optionally be coated with one or more phosphors or a phosphor containing material (not shown) using any suitable technique. The phosphors can absorb at least some of the light emitted from LED 44 and can in turn emit light having a different wavelength such that LED package 40 emits a combination of light from the LED 44 and phosphor. In one aspect, LED package 40 can emit light that is perceived as white light. In one aspect, one or more LEDs 44 selected for use can comprise wavelengths targeting cool white (CW) or warm white (WW) light upon, for example, mixing with light emitted from the phosphors or a phosphor containing material. Any suitable wavelength bin and/or phosphor combination can be selected depending upon the application and desired light emission.

The submount 42 used in LED package 40 can be selected from any suitable material, for example, an electrical insulating material with a low thermal resistance or high thermal conductivity (e.g., aluminum nitride (AlN)). For example, submount 42 can comprise a ceramic material that exhibits a high thermal conductivity of approximately 120 W/mK or higher at 100° C. or more, such as AlN. In some aspects, the thermal conductivity of AlN can range from approximately 140 W/mK to approximately 180 W/mK. AlN can have a low thermal resistance and a high thermal conductivity which allows heat to readily dissipate from the LED 44 and allows package 40 to run cooler at steady state, thereby increasing the lumen output of LED package 40. Notably, submount 42 comprises a low thermal resistance or high heat conductivity and is fully capable of removing large quantities of heat at a high enough rate away from LED 44 and/or through LED package 40 such that a thick heat spreader, for example, a thick metal trace, for example, a thick Cu trace, may not be required. As a result, thinner metal traces can be used which can provide such benefits as decreasing the cost and processing time associated with providing package 40 while unexpectedly maintaining or exceeding brightness and desired thermal performance. Notably, despite conventional wisdom that thick Cu traces are necessary for heat spreading purposes and despite manufacturing difficulties (e.g., plating and etching difficulties associated with thinner layers or films), LED packages and methods disclosed herein advantageously incorporate thinner Cu traces which led to unexpected results of no reduction in LED, device, and/or package performance over time.

One or more layers of conductive material, generally designated 46 can be provided over submount 42 using an electroless process or any other suitable technique. Electroless processes can be used for coating nonmetallic parts and can be similar to an electroplating process except that no outside current is needed. The metal ions can be reduced by chemical agents in the plating solutions and deposited on submount 42. Electroless plating or processing may be advantageous as a more uniform thickness of the metal layer can be obtained. In another aspect, submount 42 can be masked with photoresist and conductive material 46 can then be sputtered over submount thereby forming one or more areas of conductive material 46 or conductive traces. Any suitable electrically conductive material 46 can be used. In one aspect, conductive material 46 can comprise a layer of Cu that is approximately 50 μm or less in thickness, for example, a layer that is approximately 50, 45, 35, 25, or 15 μm in thickness. However, conductive material 46 of any thickness value of approximately 50 μm or less in thickness is contemplated herein. In one aspect, conductive material 46 can comprise a layer of Cu that is less than or equal to 10 μm in thickness. In other aspects, conductive material 46 can comprise a layer of Cu that is less than or equal to 5 μm in thickness. In some aspects, conductive material 46 can comprise a range of thickness from approximately 3 to 5 μm in thickness. Conductive material 46 is not limited to Cu, but can comprise any suitable electrically conducting material of any suitable thickness. In one aspect, conductive material 46 comprises any suitable electrically conducting metal or metal alloy. Notably, LED package 40 uses conductive material 46 that is approximately 50 μm or less in thickness as compared, for example, to the prior art package discussed in FIG. 1 above. Quite unexpectedly, the use of thinner Cu traces or conductive material 46 resulted in no reduction in LED, device, and/or package performance over time. That is, packages and methods disclosed herein maintained or exceeded brightness and desired thermal performance while the overall cost and processing time associated with the LED packages and methods disclosed herein decreased.

FIG. 2 further illustrates one or more gaps 48 disposed in conductive material 46. The one or more gaps 48 can electrically isolate at least a first area of conductive material 50 from a second area of conductive material 52. First and second areas of conductive material 50 and 52, respectively, can comprise conductive traces. LED 44 can be electrically connected to first conductive trace 50 via wirebonding using one or more electrically conductive wires 54 and mounted to second conductive trace 52 such that electrical current can flow into and illuminate LED 44. First and second areas of conductive material 50 and 52, respectively, can receive electrical signal or current from an electrical contact 56. Electrical contact 56 can comprise a metallized area for receiving electrical signal from an external source, for example, an electrical circuit. Electrical contact 56 can be disposed on a face of submount 42 opposite that of one or more areas of conductive material 50 and 52. The electrical current can then be passed from first and second traces or areas 50 and 52 into LED 44, thereby illuminating LED when the electrical energy is converted into light. LED package 40 can further comprise a lens 58 at least partially disposed over LED package 40 for optimizing the light pattern and placement.

Gap 48 can be formed using any suitable technique. In one aspect, gap 48 can be etched at least partially through conductive material 46. In other aspects, gap 48 can comprise an area of submount 42 that was masked with photoresist prior to sputtering conductive material 46 over submount 42. Formation of gap 48 between first and second areas of conductive material 50 and 52, respectively, can for example result in a gap 48 having a desired aspect ratio that can have a very thin gap width. While gap 48 can if desired have approximately a 1:1 or similar aspect ratio between trace thickness and gap width, gap 48 can also desirably have a width that can be less than the thickness (or depth) of gap 48. Etching a thin layer of conductive material 46 of approximately 50 μm or less in thickness T can result in a gap 48 having a depth of approximately 50 μm or less and a width W of approximately 50 μm or less (i.e., the ratio of T:W can comprise a 1:1 ratio). However, conductive material 46 of any thickness value of approximately 50 μm or less in thickness is contemplated herein. Therefore, a depth and width W for gaps 48 of any value less than approximately 50 μm is also contemplated herein. For example, width W can be approximately 45, 35, 25, or 15 μm or less where there is approximately a 1:1 ratio between T:W. Notably, one significant advantage of the smaller trace width W is the design of more efficient LEDs 44. For example, current LEDs can be limited by substrate or submount technology in the amount of trace that can fit underneath or below the small devices. By implementing thinner traces having thinner trace widths W, several traces can fit below LEDs 44, thereby encouraging chip designs that are more efficient.

In some aspects, thickness T of conductive material 46 and width W of gap 48 can comprise approximately 10 μm or less. Thinner gaps 48 can advantageously trap or block less light than thicker gaps and can therefore increase device performance. Thinner gaps 48 have thin widths W which can also allow for a smaller submount surface area and can thereby provide devices having a smaller footprint. Thinner areas of conductive material 46 can also advantageously lower the cost and time associated with manufacturing devices and packages using traces that are less than or equal to approximately 10 μm in thickness as less material is needed and more efficient processing techniques can be used. In one aspect, electroless processing techniques, immersion plating baths, metal sputter, and evaporation techniques can be used instead of electroplating to get thicker films. These processing techniques can require less processing time and equipment when compared to electroplating, while producing finer line widths and gaps 48. This could significantly lower the cost of the substrate beyond just the cost reduction from the reduced metal thickness. The whole manufacturing of the substrate can be significantly simplified. For example, prior art methods of producing thicker Cu traces require sequentially sputtering a titanium (Ti) adhesion layer and a Cu seed layer and then growing a Cu layer via plating onto the copper seed layer. Methods disclosed herein can advantageously eliminate the extraneous Cu seed growth step and can simplify the deposition process by simply depositing a thin layer of Cu and subsequently only etching it.

Another advantage of using thin metal traces, or conductive material 46, is that the volume of encapsulant can be greatly reduced. Conventional substrates having large or deep gaps require a greater amount of encapsulant and a greater effort during dispensing of the encapsulant such that reliability failures caused by encapsulant getting under the LEDs 44 can be avoided. Thin conductive material 46 having fine gaps 48 will likely eliminate such reliability failures as well as reduce the amount of encapsulant used, both of which can significantly reduce the cost of manufacturing components with direct attach (i.e., flip chip) LEDs.

As noted above, while gap 48 can if desired have approximately a 1:1 or similar aspect ratio between trace thickness T and width W, gap 48 can also desirably have, without limitation, width W measuring less than the approximate thickness and/or length and width of each individual LED 44. Table 1 below contains typical values of LED 44 length, width, and thickness measurements. Table 1 also expresses gap width W, as a ratio (i.e., percentage) of LED 44 length, width, and thickness measurements, where gap width W is assumed to have a fine width W, as described herein (i.e., equal to approximately 50 μm or less, where the ratio values in Table 1 are calculated using a value of 50 μm for width W).

TABLE 1

Table 1: Ratio of gap width to LED chip dimensions
(using gap width of approximately 50 μm)

| LED length (μm) | LED width (μm) | LED thickness (μm) | Gap Width, W (μm) | Ratio of Gap Width (W) to LED length | Ratio of Gap Width (W) to LED width | Ratio of Gap Width (W) to LED thickness |
|---|---|---|---|---|---|---|
| 220 | 270 | 50  | ≤50 μm | 22.7% | 18.5% | 100.0% |
| 240 | 320 | 115 | ≤50 μm | 20.8% | 15.6% | 43.5% |
| 240 | 360 | 115 | ≤50 μm | 20.8% | 13.9% | 43.5% |
| 260 | 480 | 115 | ≤50 μm | 19.2% | 10.4% | 43.5% |
| 300 | 410 | 140 | ≤50 μm | 16.7% | 12.2% | 35.7% |
| 350 | 470 | 155 | ≤50 μm | 14.3% | 10.6% | 32.3% |
| 280 | 280 | 170 | ≤50 μm | 17.9% | 17.9% | 29.4% |
| 380 | 380 | 170 | ≤50 μm | 13.2% | 13.2% | 29.4% |
| 480 | 480 | 170 | ≤50 μm | 10.4% | 10.4% | 29.4% |
| 580 | 580 | 170 | ≤50 μm | 8.6%  | 8.6%  | 29.4% |
| 500 | 500 | 175 | ≤50 μm | 10.0% | 10.0% | 28.6% |
| 520 | 700 | 175 | ≤50 μm | 9.6%  | 7.1%  | 28.6% |
| 520 | 700 | 250 | ≤50 μm | 9.6%  | 7.1%  | 20.0% |

As Table 1 illustrates, in one aspect, and without limitation, gap 48 can comprise a width W ranging from approximately 20 to 100% of LED 44 thickness where gap width W is approximately equal to 50 μm (i.e., and ranging from approximately 4 to 20% where gap width W is approximately equal to 10 μm). The ratio of gap width W to LED 44 thickness can comprise a range of less than approximately 4 to 20% for values of gap width W that are less than 10 μm, and can be calculated accordingly. Table 1 further illustrates gap 48 comprising a width W ranging from approximately 8.6 to 22.7%, or less than 25% of LED 44 length where gap width W is approximately equal to 50 μm (i.e., and ranging from approximately 1.7 to 4.6%, or less than 5% of LED length where gap width W is approximately equal to 10 μm). The ratio of gap width W to LED 44 length can comprise a range of less than approximately 1.7 to 4.6%, or less than 5% for values of gap width W that are less than 10 μm, and can be calculated accordingly. Table 1 further illustrates gap 48 comprising a width W ranging from approximately 7.1 to 18.5%, or less than 20% of LED 44 width where gap width W is approximately equal to 50 μm (i.e., and ranging from approximately 1.4 to 3.7%, or less than 4% of LED width where gap width W is approximately equal to 10 μm). The ratio of gap width W to LED 44 width can comprise a range of less than approximately 1.4 to 3.7%, or less than 4% for values of gap width W that are less than 10 μm, and can be calculated accordingly.

In one aspect, and without limitation, gap 48 can comprise a width W of approximately 10% or less than the distance between LEDs 44, for example, in packages comprising more than one LED 44 where the LEDs 44 are spaced apart approximately 500 μm (i.e., approximately 2% where gap width W is approximately 10 μm, and less than 2% where gap width W is finer than 10 μm). For example, depending upon the angled side of the LED 44 chosen for use in package 40, LEDs 44 can be spaced apart as close as the gap width (i.e., approximately 50 μm or less such that gap width W is equal to the chip spacing) to as far apart as approximately 500 μm. As such, gap 48 can comprise a width W of approximately 10% or less of the distance between LEDs 44. In other aspects, where LED 44 spacing is less than approximately 500 μm, the percentage can increase from approximately 10% to approximately 100% (i.e., for cases where chip spacing becomes closer to and/or equals to gap width W).

Figure 3:
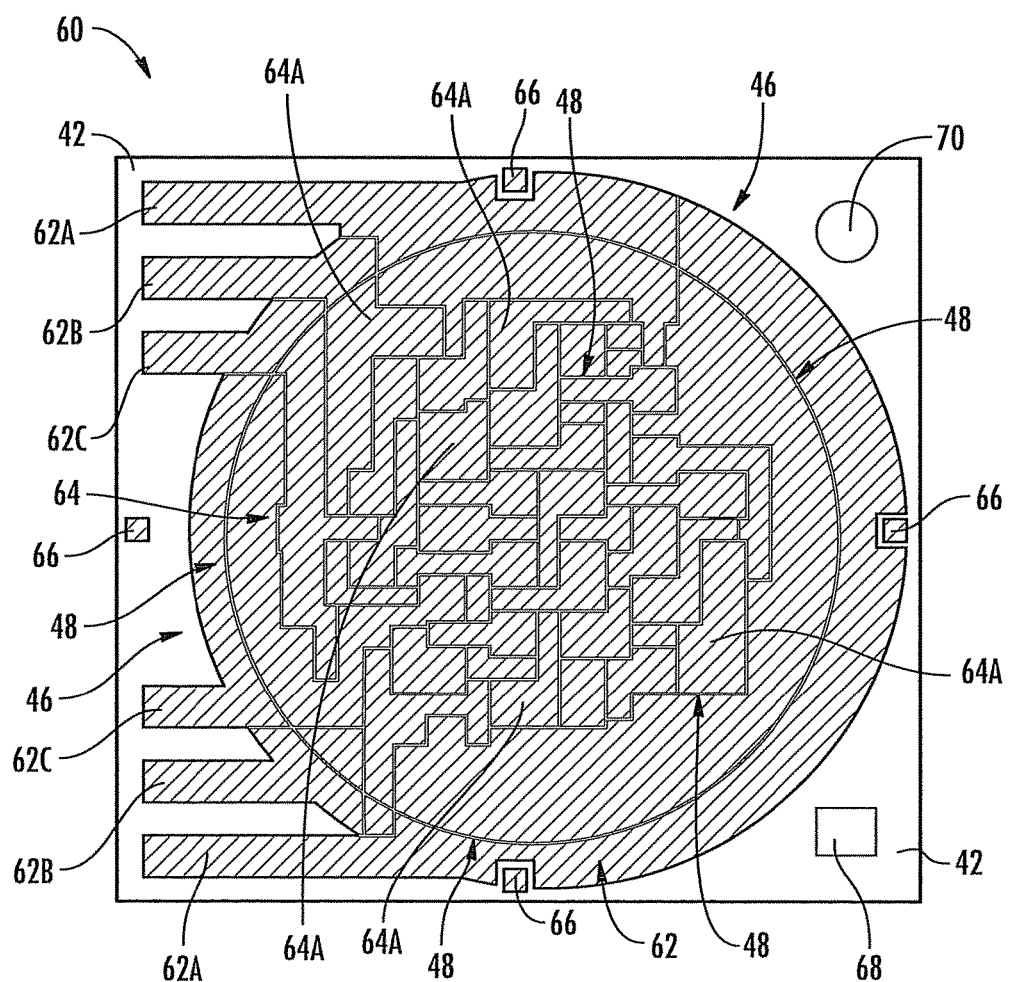
FIG. 3 is a top plan view illustrating an embodiment of a portion of an LED package according to the subject matter disclosed herein.
Figure 4:
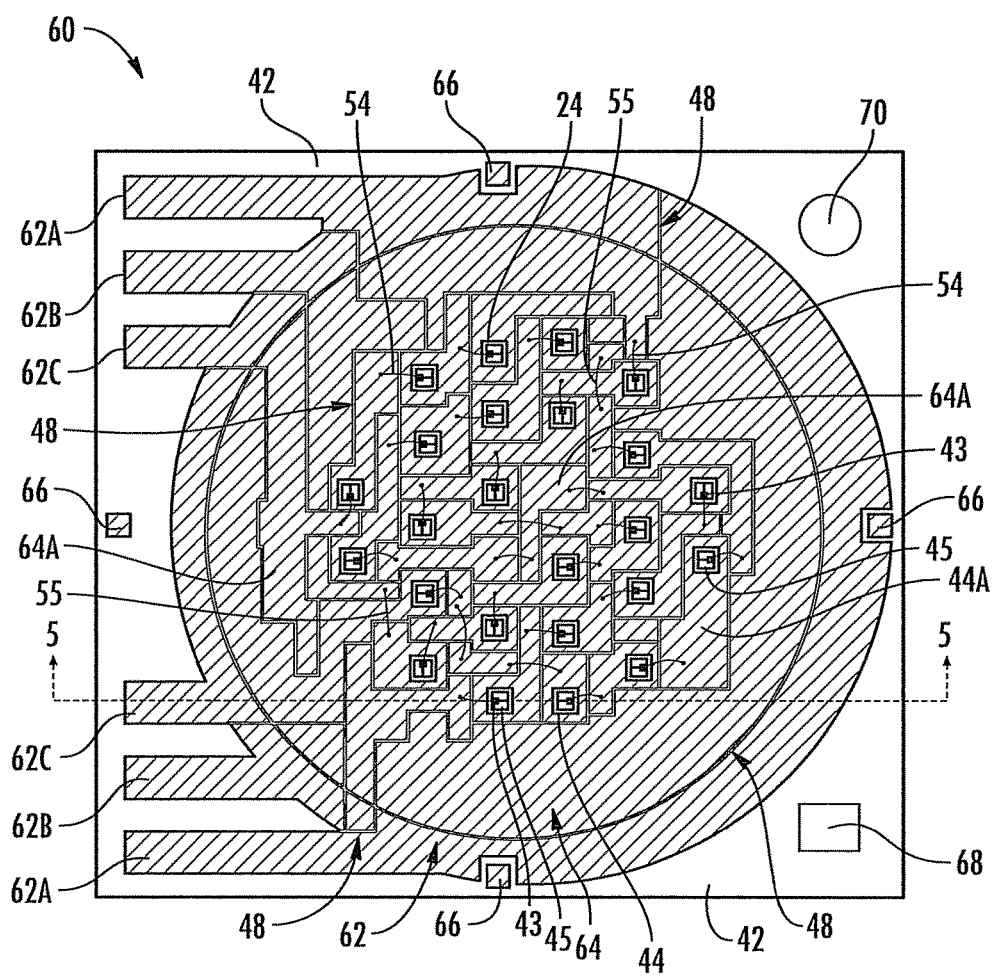
FIG. 4 is a top plan view illustrating an embodiment of a portion of an LED package according to the subject matter disclosed herein.

FIGS. 3 and 4 illustrate top perspective views of a portion of an LED package, generally designated 60. FIGS. 5 to 8 illustrate various other views of LED package 60. LED package 60 can be similar in form and function to previously described LED package 40, however, LED package 60 can comprise a plurality of gaps 48 disposed between a plurality of areas of conductive material, or conductive traces. For example, LED package 60 can comprise a layer of conductive material 46 comprising an outer portion, generally designated 62 at least partially disposed about an inner portion 64. Conductive material 46 can be deposited over submount 42 using any suitable technique, for example and not limited to the previously described electroless plating or masking/sputtering techniques. Conductive material 46 can comprise any suitable electrically conductive material, for example, a metal or metal alloy. In one aspect, conductive material 46 comprises Cu or a Cu alloy.

Outer and inner portions 62 and 64, respectively, can comprise at least a first and a second area of conductive material 46. Outer and inner portions 62 and 64 can have a thickness of approximately 50 μm or less, for example, a layer that is approximately 50, 45, 35, 25, or 15 μm in thickness. However, outer and inner portions 62 and 64 of any thickness value of approximately 50 μm or less in thickness is contemplated herein. In one aspect, outer and inner portions 62 and 64 can comprise a thickness of approximately 10 μm or less. In one aspect, outer and inner portions 62 and 64 can comprise a thickness of less than or equal to approximately 5 µm. In one aspect, outer and inner portions 62 and 64 can comprise a range of thickness of approximately 3 to 5 µm. Outer portion 62 can comprise a substantially ring shaped portion disposed about a substantially circular shaped inner portion 64. Each of outer and inner portions 62 and 64 can be divided into one or more electrically and/or thermally isolated sections by one or more gaps 48. Gaps 48 can be formed using any suitable technique, for example, and not limited to the etching or masking techniques previously described. Where desired, gaps 48 can comprise a depth and a width approximately equal to the thickness of inner and outer portions 62 and 64 comprising conductive material 46.

Outer portion 62 can comprise one or more contact portions which can terminate adjacent an edge of LED package 60. For example, outer portion can comprise one or more sets of first, second and third contact portions 62A, 62B, and 62C, respectively. First contact portions 62A can extend substantially about inner portion 64 and can comprise a single, undivided portion which can terminate at opposing ends. First contact portions 62A can comprise outermost end portions with one or more sets of second and third contact portions 62B and 62C disposed therebetween. In one aspect, first contact portions 62A can form a contact pair (i.e., anode/cathode) with second contact portions 62B. That is, each 62A-62B contact pair can provide an interface for a controllable circuit. Second contact portions 62B can be disposed between first contact portion 62A and third contact portion 62C. One or more third contact portions 62C can be disposed parallel and adjacent each other along one side of LED package 60. Third contact portions 62C can form a contact pair, that is, portions 62C-62C can provide an interface for a controllable circuit.

Still referring to FIGS. 3 and 4, inner portion 64 can comprise a substantially circular shaped portion comprising a plurality of electrically isolated mounting portions 64A. Each mounting portion 64A can be electrically isolated from each other mounting portion 64A by a plurality of gaps 48. In one aspect, package 60 can comprise twenty-four LEDs 44 and more than twenty-four mounting portions 64A. Gaps 48 can comprise small depths and widths corresponding to the thickness of inner portion 64 comprised of conductive material 46. For example, gaps 48 can have a width of approximately 50 µm or less, for example, a width of approximately 50, 45, 35, 25, or 15 µm in thickness. However, gap 48 widths of any value of approximately 50 µm or less in thickness are contemplated herein. In one aspect, gaps 48 can have a width of approximately 10 µm or less, such as approximately 5 µm or less or a range of approximately 3 to 5 µm. In one aspect, the thickness of inner portion 64 and/or outer portion 62 to gap 48 width can comprise a 1:1 ratio (i.e., the same as the 1:1 ratio between T:W of FIG. 2 described above). Conductive material 46 can comprise a thin layer of material compared to prior art packages. Gaps 48 of LED package 60 can be very thin or fine compared to prior art packages, for example, any value approximately 50 µm or less. In one aspect, gaps 48 can comprise a fine thickness of approximately 25 µm or less, or approximately 10 µm or less. In one aspect, gaps 48 can comprise a fine thickness of approximately 5 µm or less or approximately 3 µm or less. Gaps 48 can comprise a thickness of approximately 3 to 5 µm in thickness. Inner portion 64 can comprise any number, size, and/or shape of mounting portions 64A. Notably, thinner gaps 48 can decrease the amount of light that becomes trapped in between areas of conductive material 46 and the amount of light output from package 60 can be maximized. Thinner gaps 48 associated with thinner layers of conductive material unexpectedly result in no reduction in the thermal performance of the LEDs, devices, and/or packages disclosed herein. It is understood that mounting portions 64A can be arranged in many different ways and can have many different shapes and sizes.

As FIG. 4 illustrates, a plurality of LEDs 44 can be disposed over inner portion 64 at least partially over the plurality of mounting portions 64A. LEDs 44 can be electrically connected in series over inner portion 64 via wirebonding a bond pad 43 of LED 44 to mounting portions 64A using one or more conductive wires 54. Conductive wires 55 can also be used to electrically connect one or more mounting portions 64A such that electrical signal can pass from one mounting portion 64A to another and into one or more LEDs 44. LEDs 44 can comprise a conductive current spreading structure 45 and can be mounted to mounting portions 64A using known methods, for example but not limited to solder, Ag epoxy, flux-assisted, direct attach, or thermal compression die attach.

Current spreading structure 45 can generally comprise conductive portions or fingers arranged substantially in a square or grid on LED 44 with the fingers spaced to enhance current spreading from bond pad 43 into the LED's 44 top surface. In operation, an electrical signal can be applied to LED 44, such as through conductive wire 54, and the electrical signal can spreads through the fingers of the current spreading structure 45 and the top surface into LED 44. Current spreading structures are often used in LEDs 44 where the top surface is a p-type material, but they can also be used for n-type materials. LEDs 44 can comprise Group III nitride LEDs as previously described either alone and/or LEDs 44 of any other suitable material system. For example, in one aspect LEDs 44 can comprise a combination of blue GaN based LEDs 44 and red AlInGaP LEDs 44. Alternatively, LEDs 44 can comprise all blue GaN based LEDs 44 or all red AlInGaP LEDs 44. LEDs 44 of the same color and/or material system may be used alone or a combination of any suitable color and/or material system is also contemplated herein. In one aspect and without limitation, gaps 48 between outer portion 62 and inner portion 64 can have a width W measuring less than the approximate length, width, and/or thickness values of each individual LED 44 as shown and described with respect to Table 1.

LED package 60 can further comprise one or more mounting pads 66 disposed at intervals about outer portion 62 adjacent edges of LED package 60. Mounting pads 66 can be used for mounting one or more ESD protection devices (not shown). ESD protection devices can comprise any suitable ESD device known in the art, for example only and not limited to a Zener diode, ceramic capacitor, transient voltage suppression (TVS) diode, multilayer varistor, a Shottky diode, and/or a different LED arranged reverse biased to LEDs 44. ESD protection device can be mounted over mounting pad 66 and electrically connected to outer portion 62. Notably, ESD protection devices can be arranged over mounting pads 66 along outermost edges or portions of LED package 60 such that the ESD protection devices will not block and/or absorb a substantial amount of light. Light output and performance of device 60 should, therefore, not become negatively affected by the positioning and/or placement of ESD protection devices.

LED package 60 can further comprise one or more alignment areas 68 and 70 (also known as fiducials) used during application of a solder mask (not shown) over submount. Alignment areas 68 can also be used to help during registration of other steps, such as solder mask patterning. The solder mask can be included on a top surface of submount 42, for example, in areas outside inner and outer portions 62 and 64 that are not illustrated in a cross-hatch pattern. Solder masks can be applied for protecting against solder materials depositing in undesired areas, which can result in damage to the areas or result in electrical shorting. Solder masks can serve as insulating and protective material that can reduce or prevent such dangers. Solder masks can also improve brightness by reflecting light from surfaces of LED packages described herein, and may be coated over all exposed surfaces of the AlN submount 42. Alignment areas 68 and 70 can provide for alignment during fabrication of package 60 and can also allow for alignment when mounted in place by an end user.

Figure 5:
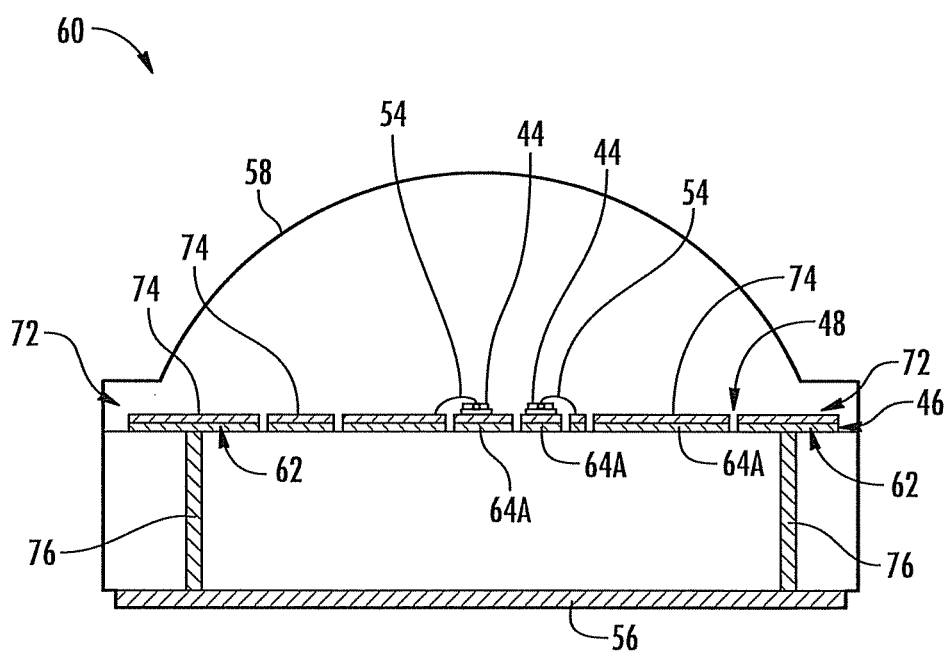
FIG. 5 is a cross-sectional view illustrating an embodiment of the LED package according to FIG. 4 with a lens.

FIG. 5 illustrates a cross-sectional view of LED package 60 along lines 5-5 of FIG. 4, the package further comprising a lens 58 at least partially disposed over the one or more LEDs 44. As FIG. 5 illustrates, one or more layers of reflective material, generally designated 72 can be disposed over conductive material 46. In one aspect, reflective material 72 can be plated or coated over conductive material 46 to maximize LED package 60 performance and optical properties. In one aspect, reflective material 72 can comprise silver (Ag) deposited over a Cu conductive material 46. The Ag reflective material 72 can comprise a thickness ranging from approximately 7 to 15 μ-inches. In one aspect, the Ag reflective material 72 can preferably comprise a thickness of approximately 0.2 to 0.5 μm. Thicknesses greater than approximately 0.5 μm and less than approximately 0.2 μm are also contemplated herein. Reflective material 72 can comprise a layer of immersion Ag that can be plated via immersion electroless plating. The Ag reflective material 72 can maximize the amount of light reflected from surfaces of package 60 thereby increasing the amount of light output from package 60. In one aspect, one or more gaps 48 can be disposed between reflective material 72 thereby forming isolated portions 74 of reflective material formed over outer and inner portions 62 and 64 of conductive material 46. In one aspect, reflective material 72 can coat the areas of submount 42 exposed in gaps 48 (not shown) or in other aspects, and as illustrated, reflective material 72 is not received in any portion of gaps 48.

FIG. 5 further illustrates one or more electrically conductive vias 76 extending between portions of conductive material 46 and electrical contact 56. Electrical contact 56 can comprise an area for contacting an external electrical element, for example, a circuit or printed circuit board (PCB) and can receive current from the external element. The electrical current can travel along the one or more electrically conductive vias 76 and can be routed to the one or more LEDs 44 using one or more conductive wires 54 and/or 55. LED package 60 can be arranged for mounting using surface mount technology and therefore utilize internal conductive paths such as conductive vias 76. In the embodiment shown, conductive vias 76 can be formed through submount 42 between electrical contact 56 and outer portions 62. Conductive vias 76 can also be formed between electrical contact 56 and inner portions 64 such that when an electrical signal is applied to electrical contact 56, the signal can be conducted to outer and inner portions 62 and 64, and therefore into the one or more LEDs 44. Conductive vias 76 and electrical contact 56 can comprise any suitable electrically conducting materials and can be formed using any suitable techniques, including previously described electroless plating and masking/deposition methods that can be used for conductive material 46 and/or reflective material 72. It is understood that instead of internally disposed conductive vias 76, one or more conductive traces can be provided on an external surface of the submount between the conductive material 46 and electrical contact 56, such as along one or more lateral side surfaces of submount 42. It is also understood that thin metal traces can be used to allow routing of electrical signal under devices which could eliminate the use of multilayer boards, or external electrical elements in some aspects. For example, as described herein, devices and methods can include metal traces or material 46 having fine width gaps 48. This can allow manufacturers to run traces for carrying electrical signal under a part versus around a part, which can allow more efficient packaging for LEDs 44 within a given space.

Figure 6:
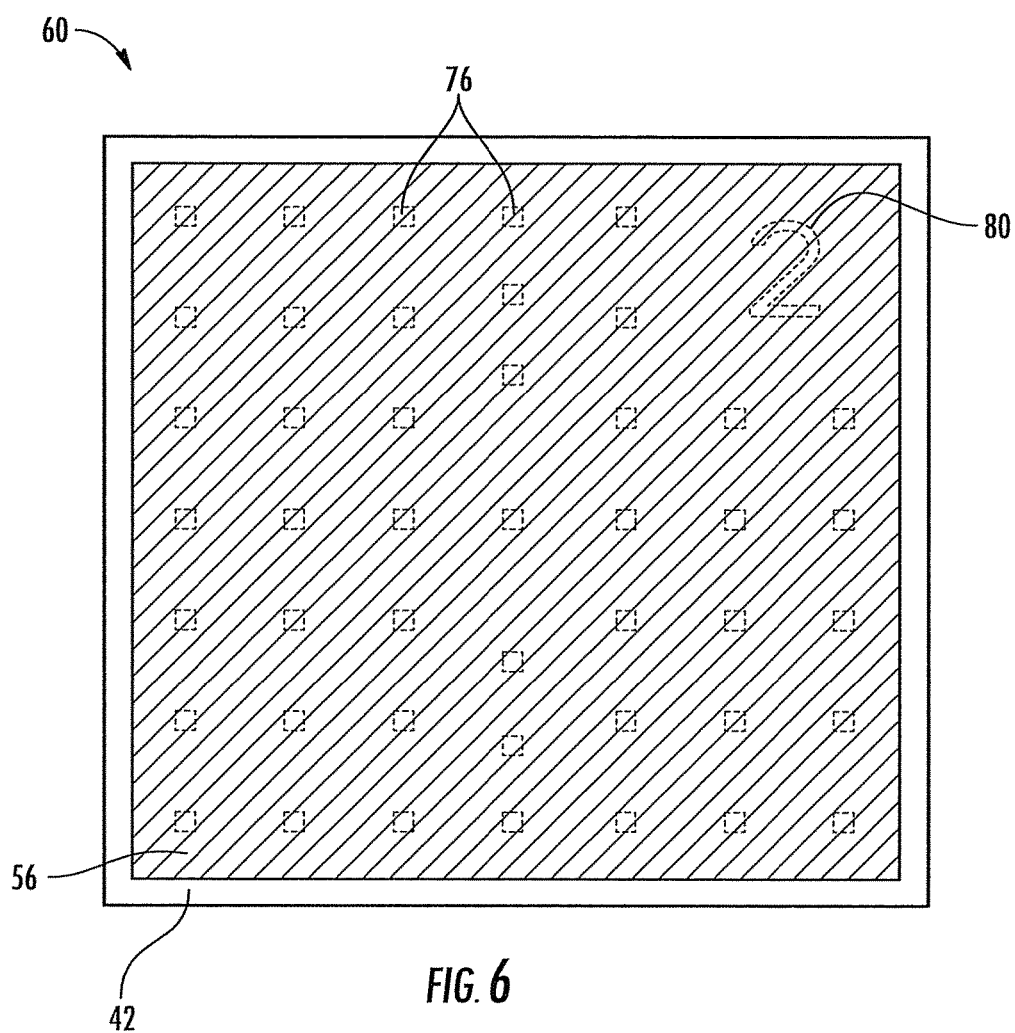
FIG. 6 is a bottom plan view illustrating an embodiment of an LED package according to the subject matter disclosed herein.

FIG. 6 illustrates a bottom view of LED package 60. LED device 60 comprises a metalized area which provides an electrical contact 56. Electrical contact 56 can comprise any suitable electrically conductive material or materials known in the art and can be deposited on submount 42 using any suitable process. In one aspect, electrical contact 56 can comprise a layer of Ti plated with Cu and Ag. The Cu can comprise a thickness of approximately 10 μm or less. In one aspect, the Cu can comprise a thickness less than or equal to approximately 5 μm and/or can range from 3 to 5 μm. The Ag can comprise a thickness ranging from 7 to 15 μ-inches. The Ti, Cu, and Ag can be deposited using an electroless plating process as previously described or using any deposition process as known in the art. Electrical contact 56 can be disposed on a face of submount 42 opposite from that which comprises conductive material 46 and one or more LEDs 44.

One or more conductive vias 76 can extend internally through submount 42 between electrical contact 56 and conductive material 46 as indicated by the phantom lines. Conductive vias 76 can extend between electrical contact 56 and outer and/or inner portions 62 and 64 (FIGS. 3 to 5) to provide electrical signal to one or more LEDs 44. Submount 42 can further comprise a substrate identifier 80 or part number as indicated by the phantom lines which can be etched into the ceramic submount 42.

Figure 7:
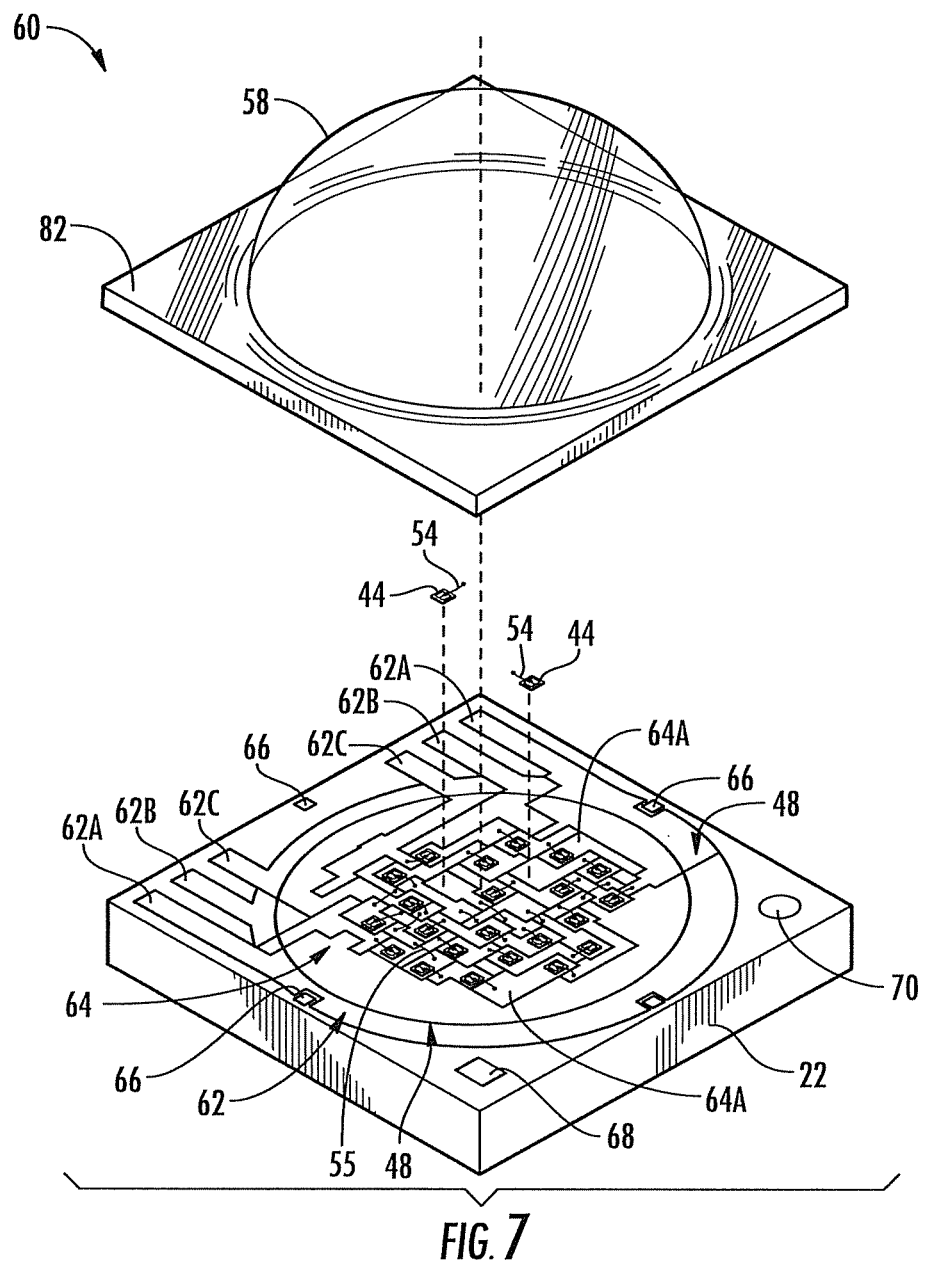
FIG. 7 is an expanded perspective view illustrating an embodiment of the LED package according to FIG. 5.
Figure 8:
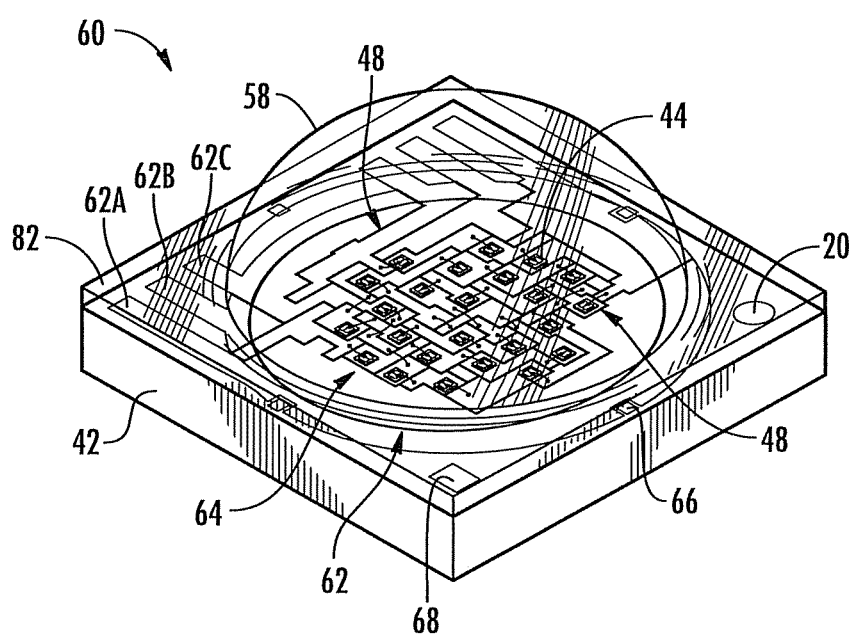
FIG. 8 is a perspective view illustrating the embodiment of the package for the LED package according to FIG. 7.

FIGS. 7 and 8 illustrate further views of LED package 60. In FIGS. 7 and 8, lens 58 is shown disposed over conductive material 46 and one or more LEDs 44. The optical element or lens 58 can be formed on a top surface of submount 42, over the one or more LEDs 44. Lens 58 can provide both environmental and/or mechanical protection. As shown, the uppermost portion of lens 58 can be located approximately a center of inner portion 64 of conductive material 46 and/or approximately a center of the plurality of LEDs 44. In one aspect, lens 58 can be molded using different molding techniques. Lens 58 can comprise any suitable shape depending on the desired shape of the light output. One suitable shape as shown is hemispheric, with some examples of alternative shapes being ellipsoid bullet, flat, hex-shaped and square. Many different materials can be used for lens 58 such as silicones, plastics, epoxies or glass, with a suitable material being compatible with molding processes. Silicone can be suitable for molding and can provide suitable optical transmission properties. It can also withstand subsequent reflow processes and does not significantly degrade over time. It is understood that lens 58 can also be textured to improve light extraction or can contain materials such as phosphors or scattering particles.

Package 60 can also comprise a protective layer 82 covering top surface of submount 42 between lens 58 and one or more edges of submount 42. Layer 82 can provide additional protection to the conductive material 46 and LEDs 44 disposed on the top surface to reduce damage and/or contamination such as grease or debris during subsequent processing steps and use. For example, protective layer 82 can also protect the one or more areas of conductive material 42 and/or reflective material 72 from peeling or lifting during processing. Protective layer 82 can be formed during formation of lens 58 and can comprise the same material as lens 58. It is understood, however, that package 60 can also be provided without protective layer 82. Lens 58 can also withstand certain sheer forces before being displaced from submount 42. In one embodiment, lens 58 can withstand approximately 1 kilogram (kg) or more of sheer force. Embodiments of package 60 using silicones that are harder after curing and have a higher durometer reading, such as Shore A 70 or higher, in molding lens 58 may tend to better withstand sheer forces. Properties such as high adhesion and high tensile strength can also contribute to the ability of lens 58 to withstand sheer forces. It is understood that the lens arrangement of LED package 60 can easily be adapted for use with secondary lens or optics that can be included over lens 58 by the end user to facilitate beam shaping. These secondary lenses are generally known in the art, with many of them being commercially available.

As described above, in conventional packages, heat typically does not spread efficiently into the submount, particularly those made of materials such as $Al_2O_3$ or ceramic. In some embodiments, when an LED is provided on an mounting portion or pad that extends generally only under the LED, heat does not spread through most of the submount, and is generally concentrated to the area just below the LED. This can cause overheating of the LED which can limit the operating power level for the LED package. Thus, typical prior art packages use thick Cu traces or components to further dissipate and/or spread heat through the device and away from the LEDs 44. However, packages 40 and 60 can have improved thermal resistance in part by using an AlN submount 42 which can dissipate approximately 10 times more heat than $Al_2O_3$ (and maybe even greater than 10 times more heat). This can also allow LEDs to run cooler, which does not degrade or affect optical properties. Thus, thick Cu traces or layers of conductive material become unnecessary. For example, in one aspect, AlN spreads heat so well that the difference between no Cu metal and 100 µm of Cu metal is only about 0.4° C./W (as compared to about 7° C./W for $Al_2O_3$). Given such a small temperature difference, and other confounding factors, there is no degradation in optical properties by using thin metal, which is advantageous.

Figure 9:
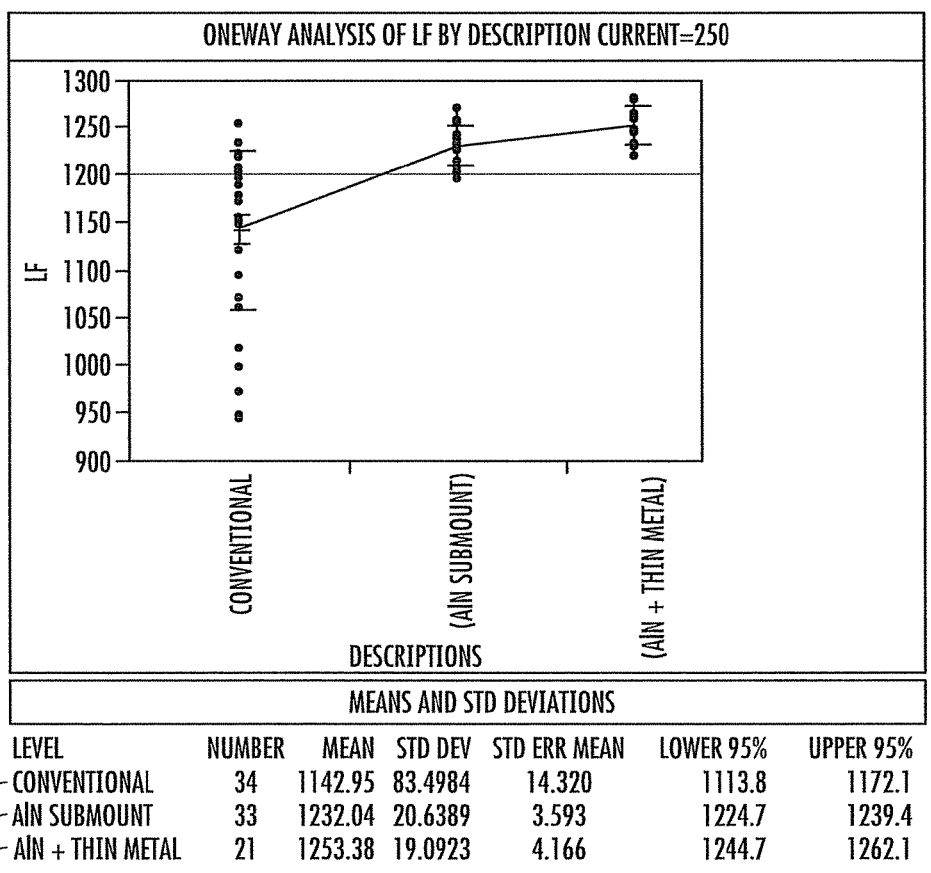
FIG. 9 is a chart analyzing luminous flux for conventional LED packages and embodiments of LED packages according to the subject matter disclosed herein.

The improved, lower thermal resistance of packages 40 and 60 can lead to lower operating temperatures for the LED by allowing quicker heat dissipation therefrom. Such lower thermal resistance can thus lead to greater lumen performance of the attached LED(s), a greater lifetime for the LED(s), and greater device reliability. As described further below, FIG. 9 illustrates that devices comprising an AlN submount 42 and thin areas of conductive material 46 can exhibit better brightness and LED performance. The thinner Cu allows for finer gaps which absorb, block, and/or trap less light. For example, as in the embodiment shown, gaps 48 can extend in straight lines and/or can comprise angled or curved lines therein. Such angles or curves can be used as markers for placement of the one or more LEDs 44. Gaps 48 can provide electrical isolation between mounting portions 64A which can prevent shorting of the signal applied to the plurality of LEDs.

Still referring to FIGS. 7 and 8, areas of conductive material 46 comprising outer and inner portions 62 and 64 can generally occupy a large surface area of submount 42. For example, outer and inner portions 62 and 64 can cover the substantial majority of the area between the outermost edges of submount 42. By extending conductive material 46 in this manner, the amount of heat which can be dissipated, or spread away from LEDs 44 can be improved. Thermal dissipation of heat generated in LEDs 44 can thus be improved, which improves the operating life and reliability of package 60. Improved thermal properties can also allow for a higher operating power of LEDs 44 and LED package 60. Outer and inner portions 62 and 64 can cover different percentages of the top surface 16 of submount 12, with a typical coverage area being greater than 50%. In LED package 60, outer and inner portions 62 and 64 can, for example, cover approximately 70% of submount 42. In other embodiments, the coverage area can, for example, be greater than 75%.

The size of submount 42 and package 60 can vary depending on different factors, such as, for example, the size of LED(s) 44. Submount 42 can comprise a thickness of approximately 0.5 millimeters (mm) as measured between top and bottom surfaces of submount 42. Thus, gap 48 can comprise a width W ranging from approximately 2 to 10% of submount 42 thickness (calculated based on gap width W ranging from 10 to 50 µm) and can be less than 2% of submount 42 thickness where gap 48 width is finer (i.e., thinner) than 10 µm. Submount 42 can comprise any suitable shape, for example and not limited to a square, rectangle, or circular shape. In one aspect, submount 42 can comprise a slightly rectangular shape having a length of approximately 13.15 mm and a width of approximately 12.15 mm. However, it is further understood that submount 42 and outer perimeter of package 60 can comprise other shapes, as viewed from above, including circular, rectangular or other multi-sided shapes.

Referring again to FIG. 9, a chart 90 is provided analyzing luminous flux for conventional LED packages and embodiments of LED packages according to the subject matter disclosed herein. Contrary to conventional wisdom which required thicker Cu traces or conductive material for heat dissipation and LED performance, the luminous flux for conventional packages 92 is unexpectedly lower in packages comprising an AlN submount 94 alone or packages having both an AlN submount and thin metal 96. Thin metal refers to thin areas or layers of conductive material 46 in packages 40 and 60 as previously described. Conductive material 46 can be approximately 10 µm or less in thickness or equal to approximately 5 µm of Cu. In some aspects, conductive material 46 can comprise a range of thickness from 3 to 5 µm. Thin metal allows for finer gap sizes which reduce the amount of light absorbed, blocked, or trapped within the gaps, which in turn increases package performance as illustrated in FIG. 9.

Conventional packages 92 comprise an average luminous flux of approximately 1,143 lumens at 250 mA. Ninety-five percent (95%) of the packages tested exhibited a luminous flux between 1,114 and 1,172 lumens at 250 mA. Thus, even the brightest conventional packages, those measuring in the top 95% were dimmer than the average luminous flu (for packages using AlN either alone or in combination with thin metal. For example, packages which use AlN submounts 94 alone had an increased luminous flux over conventional packages 92 because the thermal resistance is lower. Packages using AlN submounts 94 comprise an average luminous flux of approximately 1,232 lumens at 250 mA with 95% of the packages exhibiting between approximately 1,225 and 1,239 lumens. Packages which use AlN submounts combined with thin metal 96 comprise an average luminous flux of approximately 1,253 lumens at 250 mA with 95% of the packages exhibiting between approximately 1,245 and 1,262 lumens at 250 mA. All values were rounded to the nearest whole integer value. Thus, packages which use AlN and thin metal can measure approximately 1.7% brighter on average than packages using AlN alone and can measure approximately 8.8% brighter on average than conventional packages. Such results are unexpected in light of conventional wisdom which required thicker conductive material and/or Cu traces.

As stated above, LED packages as described above used with at least one LED can utilize thin metal components and can have a reduced thermal resistance or high thermal conductivity as compared to conventional LED packages. Thin metal components can comprise areas of Cu having a thickness of approximately 3-5 and up to less than approximately 50 µm in thickness. This can significantly lower the cost of manufacturing LED packages disclosed herein by reducing the amount of processing time and cost of Cu. In addition, the thin metal has advantageously shrinks gap widths and depths significantly due to an improved aspect ratio of the Cu. There is no reduction in performance over time due to the proper utilization of high conductively ceramic such as AlN. In fact, optical performance and brightness of LED packages disclosed herein has been shown to become improved. Embodiments of the present disclosure shown in the drawings and described above are exemplary of numerous embodiments that can be made within the scope of the appended claims. It is contemplated that the configurations of LED packages and methods with thin metal components and high thermal conductivity can comprise numerous configurations of single and multi-LED arrays other than those specifically disclosed herein.

What is claimed is:

1. A light emitting package comprising:
a first area and a second area of conductive material; and
a plurality of light emitting diode (LED) chips electrically connected to one or more of the first and second areas of conductive material,
wherein the first and second areas are each divided into a plurality of interlocked traces via a plurality of gaps,
wherein the first area is substantially circular,
wherein the second area is substantially ring shaped and is disposed outside a circumference of the first area,
wherein each trace of the plurality of traces comprises a substantially uniform thickness of approximately 25 microns (µm) or less, and
wherein each gap of the plurality of gaps comprises a width that is approximately equal to the thickness of each trace of the plurality of traces.

2. The light emitting package of claim 1, further comprising a submount, the submount comprising a ceramic material.

3. The light emitting package of claim 2, wherein the ceramic material comprises aluminum nitride (AlN).

4. The light emitting package of claim 1, wherein the conductive material comprises copper (Cu).

5. The light emitting package of claim 1, wherein each gap of the plurality of gaps comprises a depth approximately equal to the thickness of the plurality of traces.

6. The light emitting package of claim 1, wherein the first and second areas of conductive material comprise a thickness of approximately 20 µm.

7. The light emitting package of claim 2, wherein the first and second areas of conductive material cover approximately 70 percent (%) or more of a surface area of the submount.

8. The light emitting package of claim 1, wherein the first and second areas of conductive material comprise a thickness of approximately 10 µm or less.

9. The light emitting package of claim 8, wherein each gap comprises a depth of approximately 10 µm or less.

10. The light emitting package of claim 1, wherein the first and second areas of conductive material comprise a range of thickness from approximately 3 µm to approximately 5 µm.

11. The light emitting package of claim 10, wherein each gap comprises a depth ranging from approximately 3 µm to approximately 5 µm.

12. The light emitting package of claim 1, wherein a reflective material is at least partially disposed over the first and second areas of conductive material.

13. The light emitting package of claim 12, wherein the reflective material comprises silver (Ag).

14. The light emitting package of claim 1, wherein each gap comprises a width of approximately 4 to 100 percent (%) of the thickness of each LED chip.

15. The light emitting package of claim 1, wherein each gap comprises a width of less than approximately 25 percent (%) of the length of each LED chip.

16. The light emitting package of claim 1, wherein each gap comprises a width of less than approximately 20 percent (%) of the width of each LED chip.

17. The light emitting package of claim 1, further comprising electrically conductive vias.

18. A light emitting package comprising:
a ceramic submount;
at least a first electrically conductive trace and a second electrically conductive trace disposed on and contacting the submount, wherein each of the first and second traces comprises a substantially uniform thickness measuring approximately 25 microns (µm) or less, the second trace comprising an outer portion in a substantially ring shape disposed outside a periphery of the first trace;
one or more light emitting diodes (LEDs) at least partially disposed over the first trace; and
at least one gap disposed between the first and second traces, the gap comprising a width measuring approximately 25 µm or less,
wherein the first trace is divided into a plurality of interlocked traces via the at least one gap.

19. The light emitting package of claim 18, wherein the ceramic submount comprises aluminum nitride (AlN).

20. The light emitting package of claim 18, wherein the gap comprises a depth approximately equal to the thickness of the first and second traces.

21. The light emitting package of claim 18, wherein the first and second traces comprise a thickness of approximately 20 µm.

22. The light emitting package of claim 18, comprising a plurality of LEDs disposed over some of the traces.

23. The light emitting package of claim 18, wherein the first and second traces comprise a thickness of approximately 10 µm or less.

24. The light emitting package of claim 23, wherein the gap comprises a depth of approximately 10 µm or less.

25. The light emitting package of claim 18, wherein the first and second traces comprise a range of thickness from approximately 3 µm to approximately 5 µm.

26. The light emitting package of claim 25, wherein the gap comprises a depth ranging from approximately 3 µm to approximately 5 µm.

27. The light emitting package of claim 18, wherein a reflective material is at least partially disposed over the first and second traces.

28. The light emitting package of claim 27, wherein the reflective material comprises silver (Ag).

29. The light emitting package of claim 18, wherein the first and second traces comprise copper (Cu).

30. The light emitting package of claim 18, wherein the gap width ranges from approximately 4 to 100 percent (%) of a thickness of the one or more LEDs.

31. The light emitting package of claim 18, wherein the gap width is less than approximately 25 percent (%) of a length of the one or more LEDs.

32. The light emitting package of claim 18, wherein the gap width is less than approximately 20 percent (%) of a width of the one or more LEDs.

33. The light emitting package of claim 18, further comprising electrically conductive vias.

* * * * *